(12) United States Patent
Lee (10) Patent No.: US 12,276,021 B2
(45) Date of Patent: Apr. 15, 2025

(54) METHODS OF FORMING PHOSPHOSILICATE GLASS LAYERS, STRUCTURES FORMED USING THE METHODS AND SYSTEMS FOR PERFORMING THE METHODS

(71) Applicant: ASM IP Holding B.V., Almere (NL)

(72) Inventor: Seunghyun Lee, Tama (JP)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 17/677,287

(22) Filed: Feb. 22, 2022

(65) Prior Publication Data

US 2022/0267903 A1 Aug. 25, 2022

Related U.S. Application Data (60) Provisional application No. 63/153,556, filed on Feb. 25, 2021.

(51) Int. Cl.
| | | |
|---|---|---|
| *C23C 16/455* | (2006.01) | |
| *C23C 16/52* | (2006.01) | |
| *C23C 16/56* | (2006.01) | |
| *C23C 16/44* | (2006.01) | |

(52) U.S. Cl.
CPC .. *C23C 16/45529* (2013.01); *C23C 16/45542* (2013.01); *C23C 16/45553* (2013.01); *C23C 16/52* (2013.01); *C23C 16/56* (2013.01); *C23C 16/4412* (2013.01)

(58) Field of Classification Search
CPC ........ C23C 16/45529; C23C 16/45542; C23C 16/45553; C23C 16/52; C23C 16/56; C23C 16/4412; C23C 16/40; C23C 16/5096; C23C 16/401; C23C 16/30; C23C 16/44; C23C 16/455; C23C 16/50; H01L 21/02129; H01L 21/02255; H01L 21/02337
See application file for complete search history.

(56) References Cited

U.S. PATENT DOCUMENTS

| | | | | |
|---|---|---|---|---|
| 5,866,302 A | * | 2/1999 | Matsuoka | ......... H01L 21/31144 430/327 |
| 8,679,958 B2 | | 3/2014 | Takamure | |
| 9,368,352 B2 | | 6/2016 | Takamure | |
| 9,875,893 B2 | | 1/2018 | Takamure | |
| 2001/0036754 A1 | * | 11/2001 | Maeda | ............. H01L 21/02337 257/E21.243 |
| 2013/0115763 A1 | * | 5/2013 | Takamure | ......... H01L 21/02274 438/513 |
| 2014/0106574 A1 | * | 4/2014 | Kang | ................ H01L 21/02164 438/778 |
| 2016/0336178 A1 | * | 11/2016 | Swaminathan | ... H01J 37/32082 |

(Continued)

*Primary Examiner* — Katherine A Bareford
*Assistant Examiner* — Christina D Mcclure
(74) *Attorney, Agent, or Firm* — Snell & Wilmer L.L.P.

(57) ABSTRACT

Methods for forming phosphosilicate glass layers are disclosed. Exemplary methods include forming a silicon-containing layer overlying the substrate and depositing a phosphorus-containing layer overlying the substrate. The deposited phosphorus-containing layer can include $P_2O_3$ and/or exhibit a melting temperature less than or equal to 500° C. The deposited phosphorus-containing layer can be heated to flow and oxidized to provide desired properties.

18 Claims, 6 Drawing Sheets

(56) References Cited

U.S. PATENT DOCUMENTS

2016/0343799 A1* 11/2016 Yi .................... H01L 21/76828
2018/0350587 A1* 12/2018 Jia .................... H01L 21/02205
2021/0125827 A1    4/2021 Khazaka

* cited by examiner

METHODS OF FORMING PHOSPHOSILICATE GLASS LAYERS, STRUCTURES FORMED USING THE METHODS AND SYSTEMS FOR PERFORMING THE METHODS

CROSS-REFERENCE TO RELATED APPLICATIONS

This application claims the benefit of U.S. Provisional Application No. 63/153,556, filed on Feb. 25, 2021, in the United States Patent and Trademark Office, the disclosure of which is incorporated herein in its entirety by reference.

FIELD OF INVENTION

The present disclosure generally relates to methods of forming layers and structures suitable for use in the manufacture of electronic devices. More particularly, examples of the disclosure relate to methods that include formation of phosphosilicate glass layers, to systems for forming such layers, and to structures including a phosphosilicate glass layer.

BACKGROUND OF THE DISCLOSURE

During the manufacture of devices, such as semiconductor devices, it is often desirable to fill features (e.g., trenches or gaps) on the surface of a substrate with insulating or dielectric material. Some techniques to fill features include the deposition and reflow of phosphosilicate glass (PSG).

PSG films can be deposited using one of several chemical vapor deposition (CVD) techniques, such as atmospheric-pressure CVD (APCVD), reduced-pressure CVD (RPCVD), low-pressure CVD (LPCVD), plasma-enhanced CVD (PECVD), and the like. Once deposited, the PSG films can be reflowed—e.g., at temperatures of about 900° C.-1100° C.—to, for example, fill the gaps or trenches.

Although such techniques can work well for several applications, filling features using traditional PSG deposition techniques has several shortcomings. For example, CVD-deposited PSG exhibits relatively poor step coverage, and thus voids can form within the deposited material. Such voids can remain after reflowing the deposited material. In addition, relatively high temperatures and long annealing times are often used to reflow the PSG material in an effort to reduce voids. Such high temperatures and/or long anneal times may be undesirable for several applications.

As demands for device performance increase, it generally becomes increasingly difficult to apply the conventional PSG deposition and reflow techniques to manufacturing processes. Accordingly, improved methods for forming structures, particularly, for methods of filling gaps during the formation of a structure, are desired.

Any discussion, including discussion of problems and solutions, set forth in this section has been included in this disclosure solely for the purpose of providing a context for the present disclosure, and should not be taken as an admission that any or all of the discussion was known at the time the invention was made or otherwise constitutes prior art.

SUMMARY OF THE DISCLOSURE

Various embodiments of the present disclosure relate to methods of forming structures suitable for use in the formation of devices. While the ways in which various embodiments of the present disclosure address drawbacks of prior methods and structures are discussed in more detail below, in general, exemplary embodiments of the disclosure provide improved methods for filling features on a surface of a substrate and/or for forming layers or films comprising phosphorus, silicon and oxygen. Exemplary methods use a relatively low reflow temperature and thus can be used in applications in which higher-temperature reflow processes are preferably avoided.

In accordance with at least one embodiment of the disclosure, a method of forming a phosphosilicate glass layer is provided. The method includes providing a substrate within a reaction chamber, forming a silicon-containing layer overlying the substrate, and depositing a phosphorus-containing layer overlying the substrate, wherein the steps of depositing a silicon-containing layer and depositing a phosphorus-containing layer are used to form a deposited phosphosilicate glass layer. The steps of forming the silicon-containing layer and depositing the phosphorus-containing layer can be individually and/or collectively repeated a number of times to form the deposited phosphosilicate glass layer. The method can conclude with a step of depositing a silicon-containing layer. In accordance with examples of the disclosure, the deposited phosphorus-containing layer comprises $P_2O_3$. Additionally or alternatively, a melting temperature of the deposited phosphorus-containing layer can be less than 500° C., less than 250° C., less than 50° C., or less than 30° C. In accordance with various examples of the disclosure, during the step of depositing the phosphorus-containing layer, a phosphorus-containing precursor is flowed to the reaction chamber and an additional oxidant is not flowed to the reaction chamber. Exemplary phosphorus-containing precursors include alkyl-phosphorus compounds, such as a compound selected from, for example, one or more of the group consisting of trimethylphosphate (TMPO), trimethylphosphite (TMPI), triethylphosphate (TEPO), and triethylphosphite (TEPI). In accordance with further examples, during the step of forming a silicon-containing layer, a silicon-containing precursor is flowed to the reaction chamber and an additional oxidant is not flowed to the reaction chamber. Exemplary silicon-containing precursors include amino silane compounds, such as a compound selected from, for example, one or more of the group consisting of (dimethylamino)silane (DMAS), bis(dimethylamino)silane (BDMAS), bis(diethylamino)silane (BDEAS), bis(ethylmethylamino)silane (BEMAS), bis(tertbutylamino)silane (BTBAS), tris(dimethylamino)silane (TDMAS), tetrakis(dimethylamino)silane (TKDMAS), and di-isopropylaminosilane (DIPAS). In accordance with further examples of the disclosure, the step of forming the silicon-containing layer comprises exposing the silicon precursor to an inert gas plasma. In these cases, the step of flowing the silicon precursor to the reaction chamber and the step of exposing the silicon precursor to an inert gas plasma may not overlap. Similarly, the step of depositing the phosphorus-containing layer can include exposing the phosphorus-containing precursor to an inert gas plasma. In accordance with examples of these embodiments, the step of flowing the phosphorus-containing precursor to the reaction chamber and the step of exposing the phosphorus-containing precursor to the inert gas plasma do not overlap. In accordance with further examples of the disclosure, an inert gas is continuously provided to the reaction chamber during the steps of forming the silicon-containing layer and depositing the phosphorus-containing layer. In accordance with further examples, the method includes a step of heating the substrate in a non-oxidizing environment to cause the deposited phosphosilicate glass layer to flow to form a flowed phosphosilicate glass layer. A substrate temperature during the step of heating can be less than or equal to 500° C., or less than 400° C., or less than 300° C. In accordance with yet additional examples, the method includes a step of oxidizing the flowed phosphosilicate glass layer.

In accordance with yet further exemplary embodiments of the disclosure, a structure is formed, at least in part, according to a method described herein.

In accordance with yet additional examples of the disclosure, a system is provided for forming a phosphosilicate glass layer as described herein. An exemplary system includes a reaction chamber, a gas injection system fluidly coupled to the reaction chamber, a first gas source for introducing a silicon-containing precursor and optionally a carrier gas into the reaction chamber, a second gas source for introducing a phosphorus-containing precursor and optionally a carrier gas into the reaction chamber, an inert gas source for introducing an inert gas into the reaction chamber, a plasma source for forming an inert gas plasma, an exhaust source, and a controller. The controller can be configured to control gas flow into the gas injection system and for causing the system to carry out a method as described herein.

These and other embodiments will become readily apparent to those skilled in the art from the following detailed description of certain embodiments having reference to the figures; the invention not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The present disclosure generally relates to methods of depositing phosphosilicate glass layers, to methods of forming structures, to structures formed using the methods, and to systems for performing the methods and/or forming the structures. By way of examples, the methods described herein can be used to fill features, such as gaps (e.g., trenches or vias) on a surface of a substrate with phosphosilicate glass. As set forth in more detail below, exemplary methods include depositing or forming a phosphosilicate glass layer, and reflow of the deposited phosphosilicate glass layer at relatively lower temperatures.

In this disclosure, "gas" can refer to material that is a gas at normal temperature and pressure, a vaporized solid and/or a vaporized liquid, and may be constituted by a single gas or a mixture of gases, depending on the context. A gas other than the process gas, i.e., a gas introduced without passing through a gas distribution assembly, such as a showerhead, other gas distribution device, or the like, may be used for, e.g., sealing the reaction space, which includes a seal gas, such as a rare gas. In some cases, the term "precursor" can refer to a compound that participates in the chemical reaction that produces another compound, and particularly to a compound that constitutes a film matrix or a main skeleton of a film, whereas the term "reactant" can refer to a compound, in some cases other than precursors, that activates a precursor, modifies a precursor, or catalyzes a reaction of a precursor. In some cases, the terms precursor and reactant can be used interchangeably. The term "inert gas" refers to a gas that does not take part in a chemical reaction to an appreciable extent and/or a gas that excites a precursor when plasma power is applied, but may not become a part of a film matrix to an appreciable extent. In accordance with examples of the disclosure, an inert gas can include one or more of argon, helium, and nitrogen.

As used herein, the term "substrate" can refer to any underlying material or materials that may be used to form, or upon which, a device, a circuit, or a film may be formed. A substrate can include a bulk material, such as silicon (e.g., single-crystal silicon), other Group IV materials, such as germanium, or compound semiconductor materials, such as GaAs, and can include one or more layers overlying or underlying the bulk material. Further, the substrate can include various features, such as gaps, recesses, vias, lines, and the like formed within or on at least a portion of a layer or bulk material of the substrate. By way of examples, one or more features can have a width of about 10 nm to about 100 nm, a depth or height of about 30 nm to about 1000 nm, and/or an aspect ratio of about 3 to 100 or about 3 to about 20.

In some embodiments, "film" refers to a layer extending in a direction perpendicular to a thickness direction. In some embodiments, "layer" refers to a structure having a certain thickness formed on a surface or a synonym of film or a non-film structure. A film or layer may be constituted by a discrete single film or layer having certain characteristics or multiple films or layers, and a boundary between adjacent films or layers may or may not be clear and may or may not be established based on physical, chemical, and/or any other characteristics, formation processes or sequence, and/or functions or purposes of the adjacent films or layers. The layer or film can be continuous—or not.

As used herein, the term "silicon-containing layer" can refer to a layer whose chemical formula can be represented as including silicon. Silicon-containing layers can include other elements, such as one or more of oxygen, carbon, hydrogen, nitrogen, or the like that may be derived from a precursor or reactant. By way of example, a silicon-containing layer can include a silicon oxide, such as silicon dioxide.

As used herein, the term "phosphorus-containing layer" can refer to a layer whose chemical formula can be represented as including phosphorus. Phosphorus-containing layers can include other elements, such as one or more of oxygen, carbon, hydrogen, nitrogen, or the like that may be derived from a precursor or reactant. By way of example, a deposited phosphorus-containing layer can include a phosphorus oxide, such as a phosphorus oxide that primarily comprises (e.g., greater than 50 at %, greater than 75 at %, or greater than 90 at %) $P_2O_3$.

As used herein, the term "phosphosilicate glass layer" can refer to a layer whose chemical formula can be represented as including silicon, phosphorus, and oxygen. Phosphosilicate glass layer layers can include other elements, such as one or more of carbon, hydrogen, nitrogen, or the like that may be derived from a precursor or reactant.

As used herein, the term "structure" can refer to a partially or completely fabricated device structure. By way of examples, a structure can include a substrate with one or more layers and/or features formed thereon.

As used herein, the term "cyclic deposition process" can refer to a vapor deposition process in which deposition cycles, typically a plurality of consecutive deposition cycles, are conducted in a process chamber. Cyclic deposition processes can include cyclic chemical vapor deposition (CVD) and atomic layer deposition (ALD) processes. A cyclic deposition process can include one or more cycles that include plasma activation of a precursor, a reactant, and/or an inert gas.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments. Further, in this disclosure, the terms "including," "constituted by" and "having" or the like can refer independently to "typically or broadly comprising," "comprising," "consisting essentially of," or "consisting of" in some embodiments. In this disclosure, any defined meanings do not necessarily exclude ordinary and customary meanings in some embodiments.

In this disclosure, "continuously" can refer to one or more of without breaking a vacuum, without interruption as a timeline, without any material intervening step, without changing treatment conditions, immediately thereafter, as a next step, or without an intervening discrete physical or chemical structure between two structures other than the two structures in some embodiments.

Figure 1:
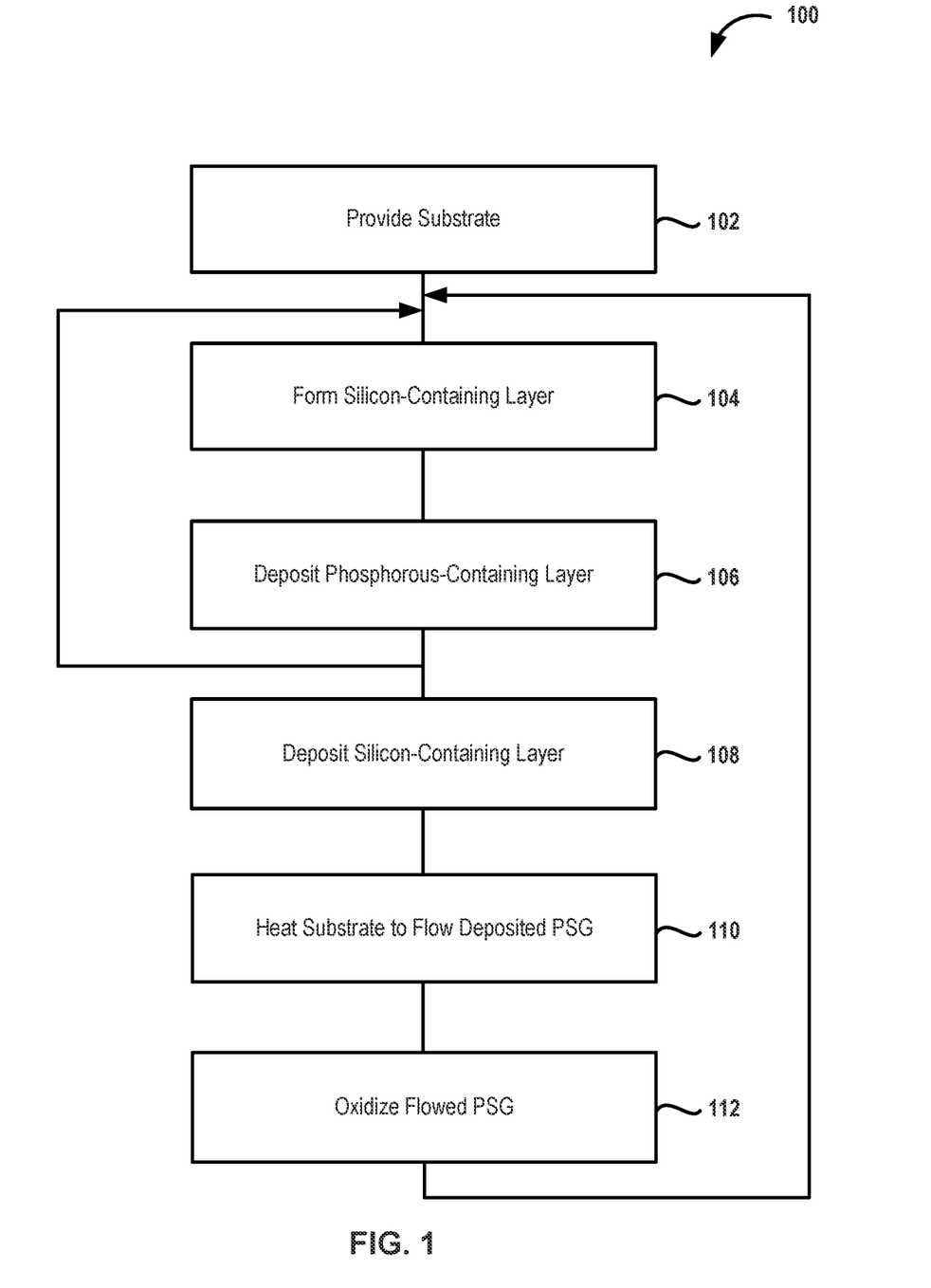
FIG. 1 illustrates a method in accordance with exemplary embodiments of the disclosure.

Turning now to the figures, FIG. 1 illustrates a method 100 of forming a phosphosilicate glass layer in accordance with examples of the disclosure. FIGS. 3-6 illustrate structures formed or used during method 100.

Method 100 includes the steps of providing a substrate within a reaction chamber (step 102), forming a silicon-containing layer (step 104), and depositing a phosphorus-containing layer (step 106). As described in more detail below, steps 104 and/or 106 and optionally step 108 can be repeated individually and/or collectively to form a deposited phosphosilicate glass layer. Method 100 can also include depositing a silicon-containing layer (step 108), heating the substrate to cause the deposited phosphosilicate glass layer to flow to form a flowed phosphosilicate glass layer (step 110), and/or oxidizing the flowed phosphosilicate glass layer (step 112). Various steps of method 100, such as steps 104-108, can be performed within one or more chambers of a chemical vapor deposition (CVD), plasma-enhanced CVD (PECVD), atomic layer deposition (ALD), or plasma-enhanced ALD (PEALD) reactor system.

Figure 3:
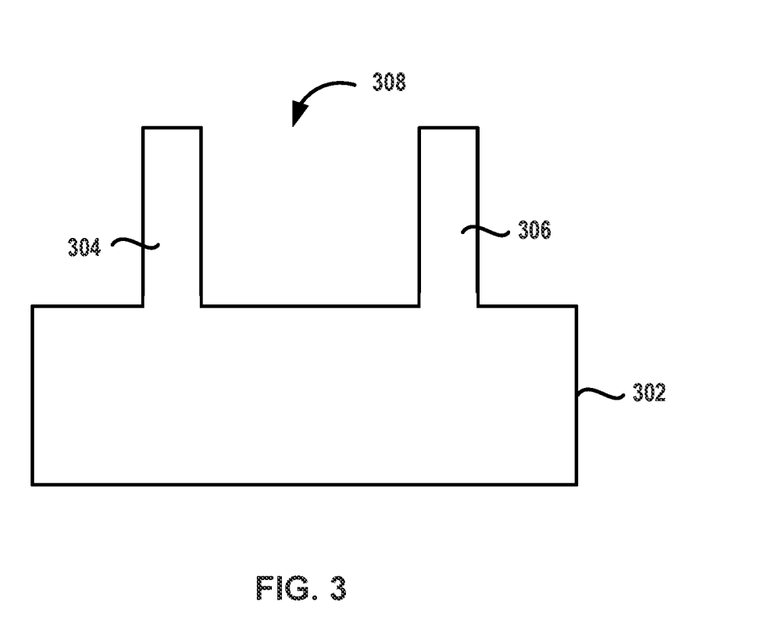
FIGS. 3-6 illustrate structures in accordance with examples of the disclosure.

Step 102 includes providing a substrate into a reaction chamber. FIG. 3 illustrates an exemplary substrate 302, including features 304 and 306, having a recess 308 formed therebetween.

The substrate may be heated to a deposition temperature. For example, the substrate may comprise one or more partially fabricated device structures, and the substrate may be heated to a deposition temperature of less than 500° C., less than 250° C., less than 50° C., or less than 30° C. Additionally or alternatively, the deposition temperature can be greater than 20° C. or greater than 25° C. In addition, the pressure within the reaction chamber may be controlled. For example, the pressure within the reaction chamber during a deposition process may be less than 2000 Pa, less than 1500 Pa, or less than 1000 Pa and/or greater than 200 Pa, greater than 400 Pa, or greater than 800 Pa.

Figure 2:
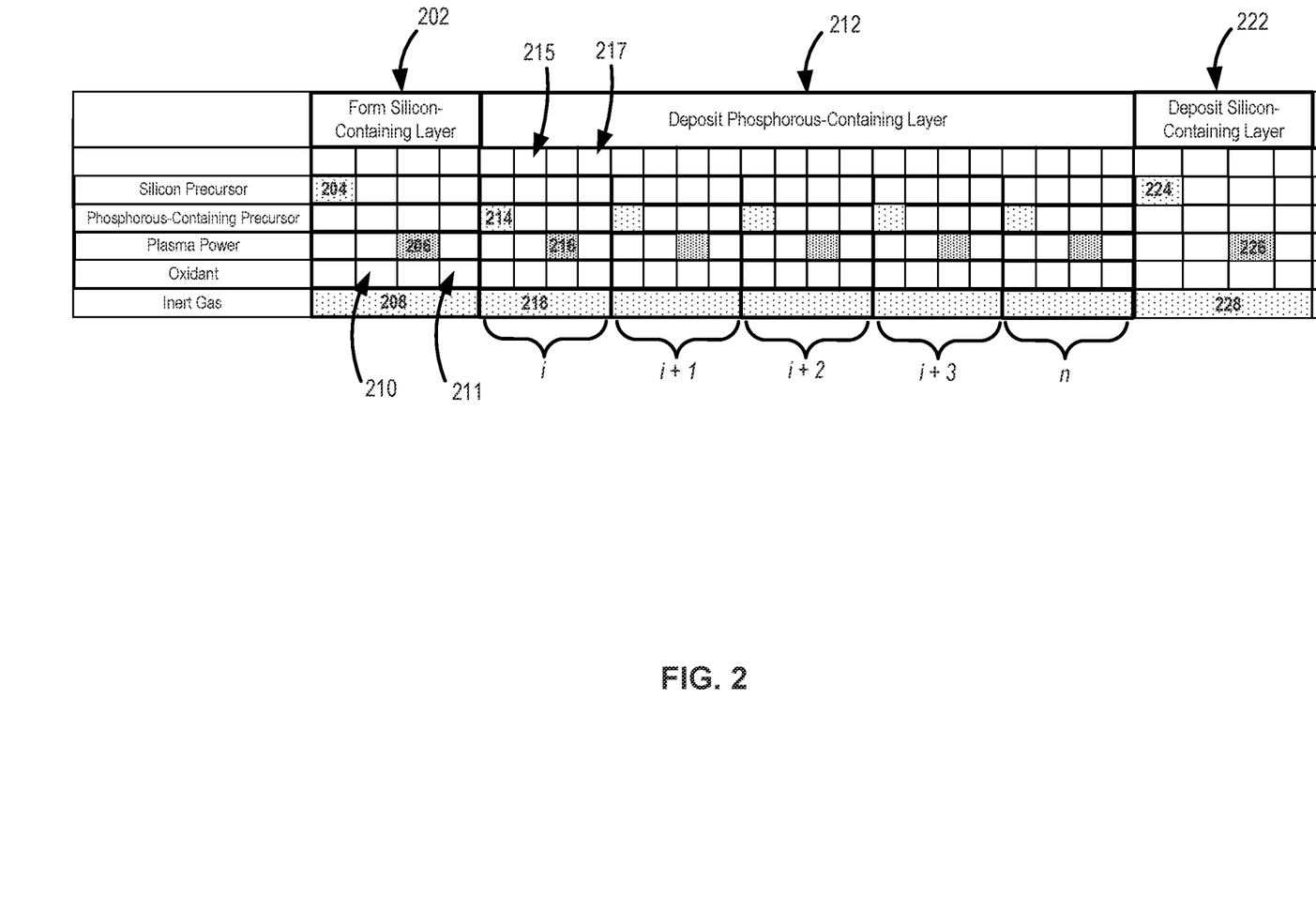
FIG. 2 illustrates a timing sequence in accordance with at least one embodiment of the disclosure.

During step 104, a silicon-containing layer is formed overlying the substrate. In accordance with examples of the disclosure, the silicon-containing layer is formed using a cyclical deposition process. A temperature and pressure within a reaction chamber during step 104 can be the same or similar to the temperature and pressure within the reaction chamber noted above in connection with step 102. By way of example, and as illustrated in FIG. 2, a cyclical process to form a silicon-containing layer 202 can include one or more cycles, each cycle including providing a silicon precursor to the reaction chamber and exposing the silicon precursor to an inert gas plasma. In the illustrated example, the cyclical process to form a silicon-containing layer 202 can include providing a silicon precursor for a pulse 204, providing a plasma power for a plasma pulse 206, and providing an inert gas for a period 208. In accordance with examples of the disclosure, it may be desirable to keep an amount of oxygen in the silicon-containing layer relatively low. Accordingly, in accordance with examples of the disclosure, an additional oxidant is not flowed to the reaction chamber during the step of forming the silicon-containing layer. In these cases, only a silicon precursor and an inert gas are flowed to the reaction chamber during the step of forming a silicon-containing layer. A duration of pulse 204 can range from about 0.2 second to about 5 second. A duration of plasma pulse 206 can range from about 0.2 second to about 5 second. A flowrate of the silicon precursor during pulse 204 can range from about 500 sccm to about 6000 sccm. A flowrate of the inert gas during step 208 can range from about 500 sccm to about 6000 sccm. A power for producing a plasma during pulse 206 can be between about 50 W and about 1000 W. A frequency of the power can be between about 13.56 MHz and about 60 MHz. A duration of pulse 206 can range from about 10% to about 100%.

The silicon precursor can include an aminosilane compound. By way of examples, the silicon precursor can be selected from one or more of the group consisting of (dimethylamino)silane (DMAS), bis(dimethylamino)silane (BDMAS), bis(diethylamino)silane (BDEAS), bis(ethylmethylamino)silane (BEMAS), bis(tertbutylamino)silane (BTBAS), tris(dimethylamino)silane (TDMAS), tetrakis(dimethylamino)silane (TKDMAS), and di-isopropylaminosilane (DIPAS).

As illustrated in FIG. 2, in accordance with examples of the disclosure, a step of flowing the silicon precursor to the reaction chamber (silicon precursor pulse 204) and the step of exposing the silicon precursor to an inert gas plasma (plasma pulse 206) do not overlap in time and/or space. As further illustrated, silicon precursor pulse 204 and plasma pulse 206 can be separated by a purge pulse 210 that includes providing a purge gas, such as the inert gas, to the reaction chamber. Additionally or alternatively, the cyclical process to form a silicon-containing layer 202 can include a purge pulse 211.

Although only one cycle is illustrated in FIG. 2, the cyclical process to form a silicon-containing layer 202 can include one or more cycles. For example, the silicon precursor for a pulse 204 and the plasma pulse 206 can be repeated prior to proceeding to step 106.

With reference again to FIG. 1, step 106 includes depositing a phosphorus-containing layer overlying the substrate. A temperature and pressure within a reaction chamber during step 106 can be the same or similar to the temperature and pressure within the reaction chamber noted above in connection with step 102.

In accordance with examples of the disclosure, the phosphorus-containing layer is formed using a cyclical deposition process 212, as illustrated in FIG. 2. Cyclical deposition process 212 can include one or more cycles (i-n), each cycle including flowing a phosphorus-containing precursor to the reaction chamber for a phosphorus precursor pulse 214, exposing the phosphorus-containing precursor to an inert gas plasma for a plasma pulse 216, and an inert gas pulse 218. In accordance with examples of the disclosure, it may be desirable to keep an amount of oxygen in the phosphorus-containing layer relatively low. Accordingly, in accordance with examples of the disclosure, an additional oxidant is not flowed to the reaction chamber during the step of depositing a phosphorus-containing layer. In these cases, only a phosphorus-containing precursor and an inert gas are flowed to the reaction chamber during the step of depositing the phosphorus-containing layer 212. In accordance with examples of the disclosure, the deposited phosphorus-containing layer comprises, e.g., predominately, $P_2O_3$. Additionally or alternatively, a melting temperature of the deposited phosphorus-containing layer can be less than 500° C., less than 250° C., less than 50° C., or less than 30° C.

A duration of plasma pulse 216 can range from about 0.2 second to about 5 second. A flowrate of the phosphorus-containing precursor during pulse 214 can range from about 500 sccm to about 6000 sccm. A flowrate of the inert gas during step 218 can be the same as described above in connection with step 202. A power for producing a plasma during pulse 216 can be between about 50 W and about 1000 W; a frequency of the power can range from about 13.56 MHz to about 60 MHz. A duration of pulse 216 can range from about 10% to about 100%. Each cycle i can include one or more purge pulses 215, 217, which can be the same or similar to purge pulses 210, 211.

The phosphorus-containing precursor can include a compound comprising phosphorus bonded to one or more (e.g., 4) oxygen atoms, wherein one or more of the oxygen atoms is boned to a C1-C4 hydrocarbon. By way of particular examples, the phosphorus-containing precursor can include one or more of trimethylphosphite (TMPI), triethylphosphate (TEPO), and/or trimethylphosphate (TMPO).

In accordance with examples of the disclosure, the step of flowing the phosphorus-containing precursor to the reaction chamber (phosphorus precursor pulse 214) and the step of exposing the phosphorus-containing precursor to the inert gas plasma (plasma pulse 216) do not overlap. As further illustrated, phosphorus precursor pulse 214 and plasma pulse 216 can be separated by purge pulse 215.

Returning to FIG. 1, step 108 can include depositing another silicon-containing layer. Step 108 can be the same or similar to step 104. For example, step 108 can include a cyclical process 222 that includes providing a silicon precursor for a pulse 224, providing a plasma power for a plasma pulse 226, and providing an inert gas for a period 228. Pulse 224, plasma pulse 226, and period 228 can be the same or similar to pulse 204, plasma pulse 206, and period 208.

Although illustrated as separate pulse steps 208, 218, and 228, an inert gas can be continuously provided to the reaction chamber during the steps of forming/depositing the silicon-containing layer and depositing the phosphorus-containing layer (steps 104-108).

Figure 4:
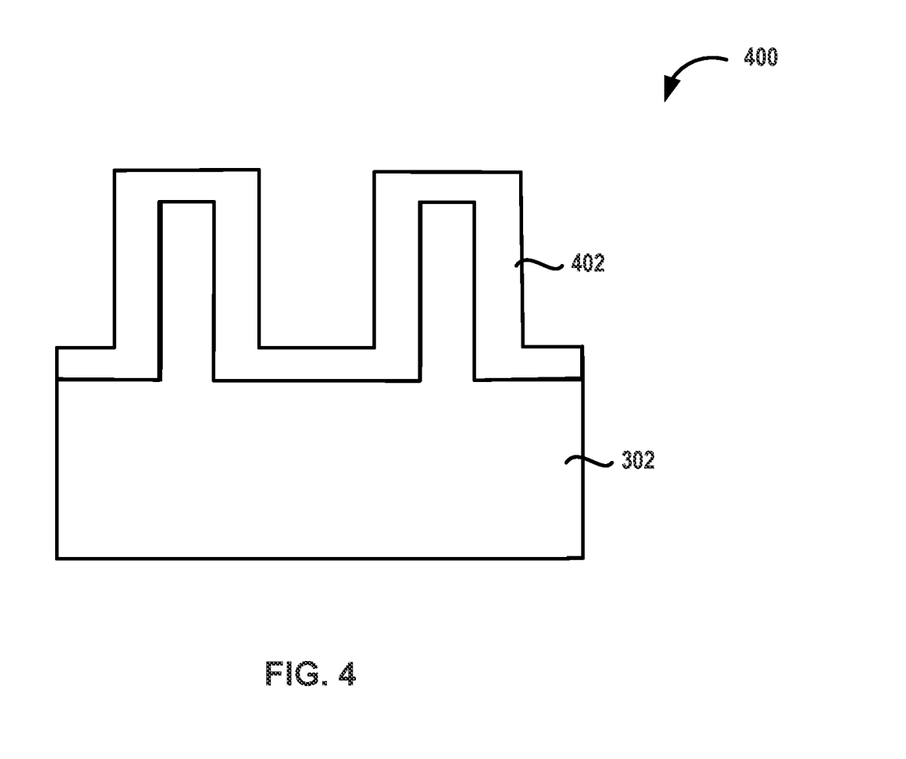

FIG. 4 illustrates a structure 400, including substrate 302 and a deposited phosphosilicate glass layer 402—e.g., formed using steps 102-108. As illustrated, deposited phosphosilicate glass layer 402 may be relatively conformal.

Figure 5:
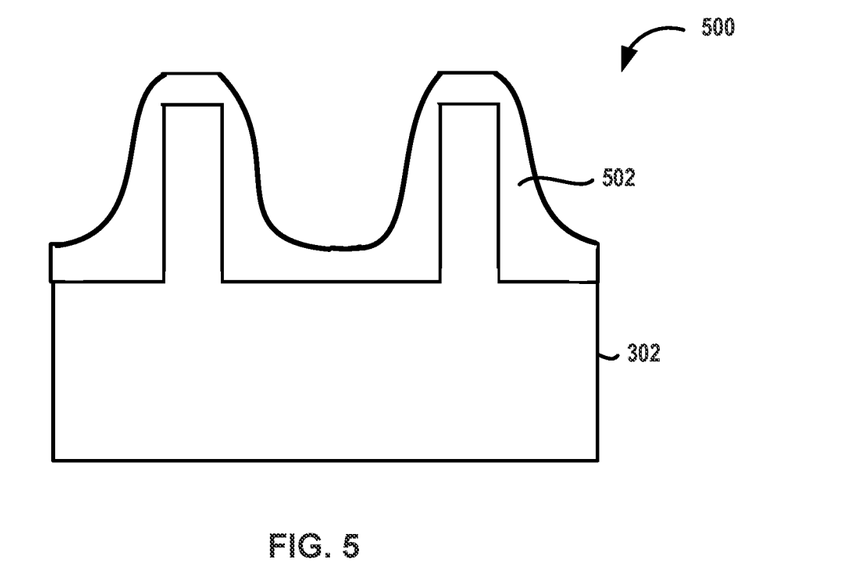

Once a desired amount of deposited phosphorus-containing layer is formed on a surface of a substrate, the substrate is heated to cause the deposited phosphosilicate glass layer to flow to form a flowed phosphosilicate glass layer during step 110. FIG. 5 illustrates a structure 500, including substrate 302 and a flowed phosphosilicate glass layer 502.

In accordance with examples of the disclosure, step 110 is performed in a non-oxidizing environment. Performing step 110 in a non-oxidizing environment allows the deposited phosphorus-containing layer to flow at relatively low temperatures. Step 110 can include heating the substrate to a temperature of less than or equal to 500° C., or less than 400° C., or less than 300° C. A pressure within the reaction chamber during step 110 can be between about 200 Pa and about atmospheric pressure. An inert gas can be provided to the reaction chamber during step 110. The flowrate of the inert gas can be between about 500 sccm and about 6000 sccm.

Figure 6:
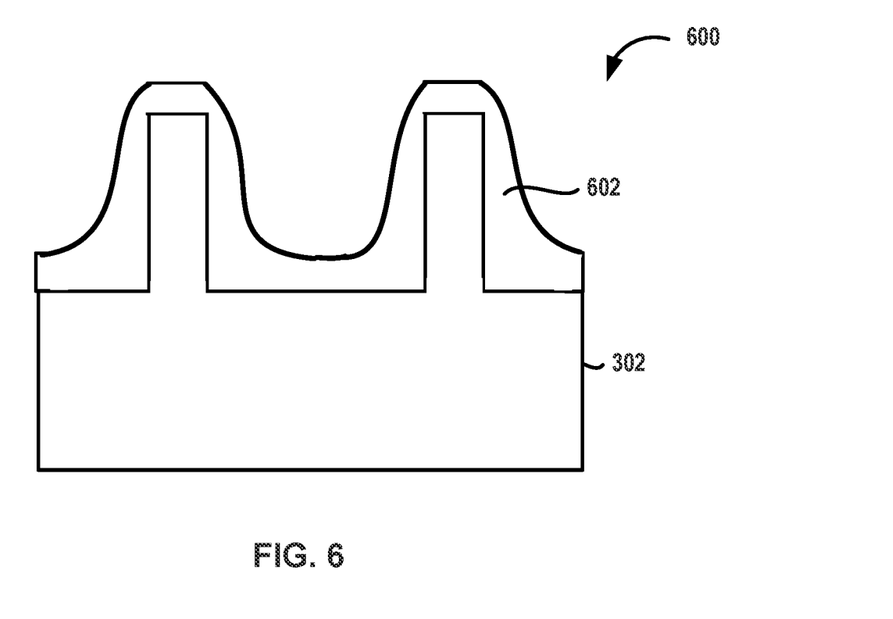

Once step 110 is completed, method 100 can proceed to step 112 of oxidizing the flowed phosphosilicate glass layer. FIG. 6 illustrates a structure 600, which includes an oxidized flowed phosphosilicate glass layer 602.

During this step, an oxidant, such as one or more of $O_2$, N2O, N2, H2O, or the like can be flowed within a reaction chamber. A flowrate of the oxidant to the reaction chamber can be about 500 sccm to about 6000 sccm. A pressure within the reaction chamber during step 112 can be about 200 Pa to about atmospheric pressure; a temperature in the reaction chamber during step 112 can be about 300° C. to about 500° C. The oxidant can cause the flowed phosphosilicate glass layer to oxidize to, for example, form $P_2O_5$.

Further described herein is a system. An exemplary system can include a reaction chamber, a plasma source, a gas injection system, a phosphorus-containing precursor gas source, a silicon-containing gas precursor source, an inert gas source, an exhaust source, and a controller. The reaction chamber can include a substrate support and an upper electrode. The substrate support can be or include a lower electrode. The plasma power source can be arranged for generating (e.g., a radio frequency) power waveform. The gas injection system is in fluid connection with the reaction chamber and is arranged for introducing a silicon precursor and/or a phosphorus-containing precursor into the reaction chamber. Optionally, the silicon precursor and/or phosphorus-containing precursor is introduced in the reaction chamber by means of a carrier gas. The exhaust is suitably arranged for removing reaction products and unused precursors from the reaction chamber. The controller is programmed or otherwise configured to cause the methods described elsewhere herein to be conducted. The controller(s) communicate with the various power sources, heating systems, pumps, robotics, and gas flow controllers or valves of the system, as will be appreciated by the skilled artisan.

In some embodiments, the gas injection system comprises a precursor delivery system that employs a carrier gas for carrying the precursor to one or more reaction chambers. In some embodiments, continuous flow of carrier gas is accomplished using a flow-pass system. In the flow-pass system, a carrier gas line is provided with a detour line having a precursor reservoir (bottle), and the main line and the detour line are switched, wherein when only a carrier gas is intended to be fed to a reaction chamber, the detour line is closed, whereas when both the carrier gas and the precursor gas are intended to be fed to the reaction chamber, the main line is closed and the carrier gas flows through the detour line and flows out from the bottle together with the precursor gas. In this way, the carrier gas can continuously flow into the reaction chamber and can carry the precursor gas in pulses by switching the main line and the detour line.

Figure 7:
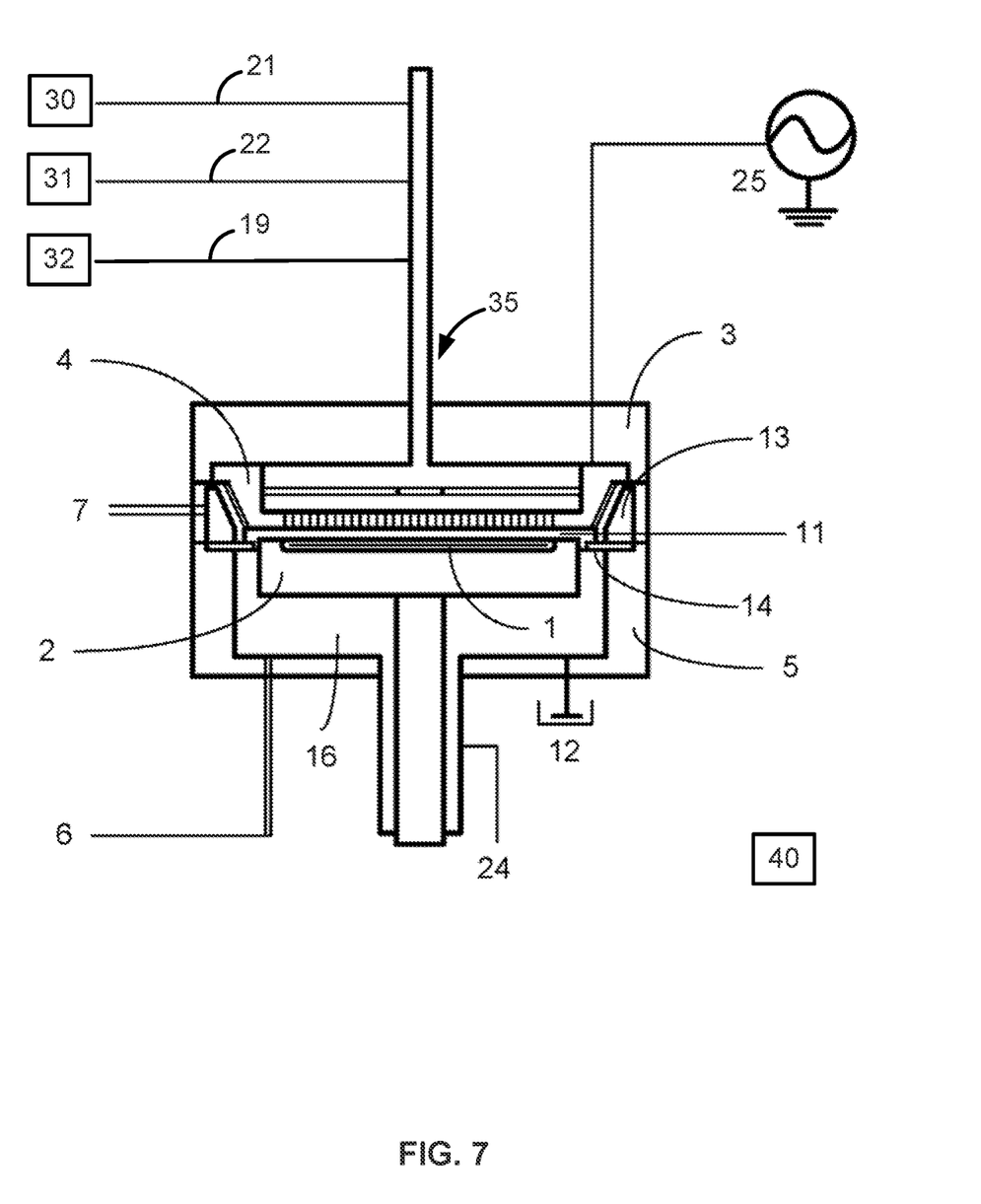
FIG. 7 illustrates a system in accordance with at least one embodiment of the disclosure.

The presently provided methods may be executed in any suitable apparatus, including in a system, as shown in FIG. 7. Similarly, the presently provided structures may be manufactured in any suitable apparatus, including a system as shown in FIG. 7.

FIG. 7 is a schematic view of a plasma-enhanced cyclical deposition apparatus with controls programmed to conduct the cyclical sequences described herein, usable in at least some embodiments of the present disclosure. In this figure, by providing a pair of electrically conductive flat-plate electrodes 2, 4 in parallel and facing each other in the interior 11 (reaction zone) of a reaction chamber 3, applying RF power (e.g., at 13.56 MHz and/or 27 MHz) from a plasma power source 25 to one side, and electrically grounding the other side 12, a plasma is excited between the electrodes. A temperature regulator may be provided in a lower stage 2, i.e., the lower electrode. A substrate 1 is placed thereon and its temperature can be kept constant at a desired temperature. The upper electrode 4 can serve as a shower plate of a gas injection system 35, and precursor gases and/or a dilution gas, if any, can be introduced into the reaction chamber 3 through a gas line 19, a gas line 21 and a gas line 22, from gas sources 30, 31, and 32, respectively, and through the shower plate 4. Additionally, in the reaction chamber 3, a circular duct 13 with an exhaust line 7 is provided, through which the gas in the interior 11 of the reaction chamber 3 is exhausted. Additionally, a transfer chamber 5 is disposed below the reaction chamber 3 and is provided with a gas seal line 24 to introduce seal gas into the interior 11 of the reaction chamber 3 via the interior 16 of the transfer chamber 5 wherein a separation plate 14 for separating the reaction zone and the transfer zone is provided. Note that a gate valve through which a wafer may be transferred into or from the transfer chamber 5 is omitted from this figure. The transfer chamber is also provided with an exhaust line 6. In some embodiments, depositing the gap filling fluid, flowing the material, and oxidizing the material is done in one and the same reaction chamber. In some embodiments, depositing the gap filling fluid and heating and/or oxidizing is done in separate reaction chambers comprised in one and the same system.

Figure 8:
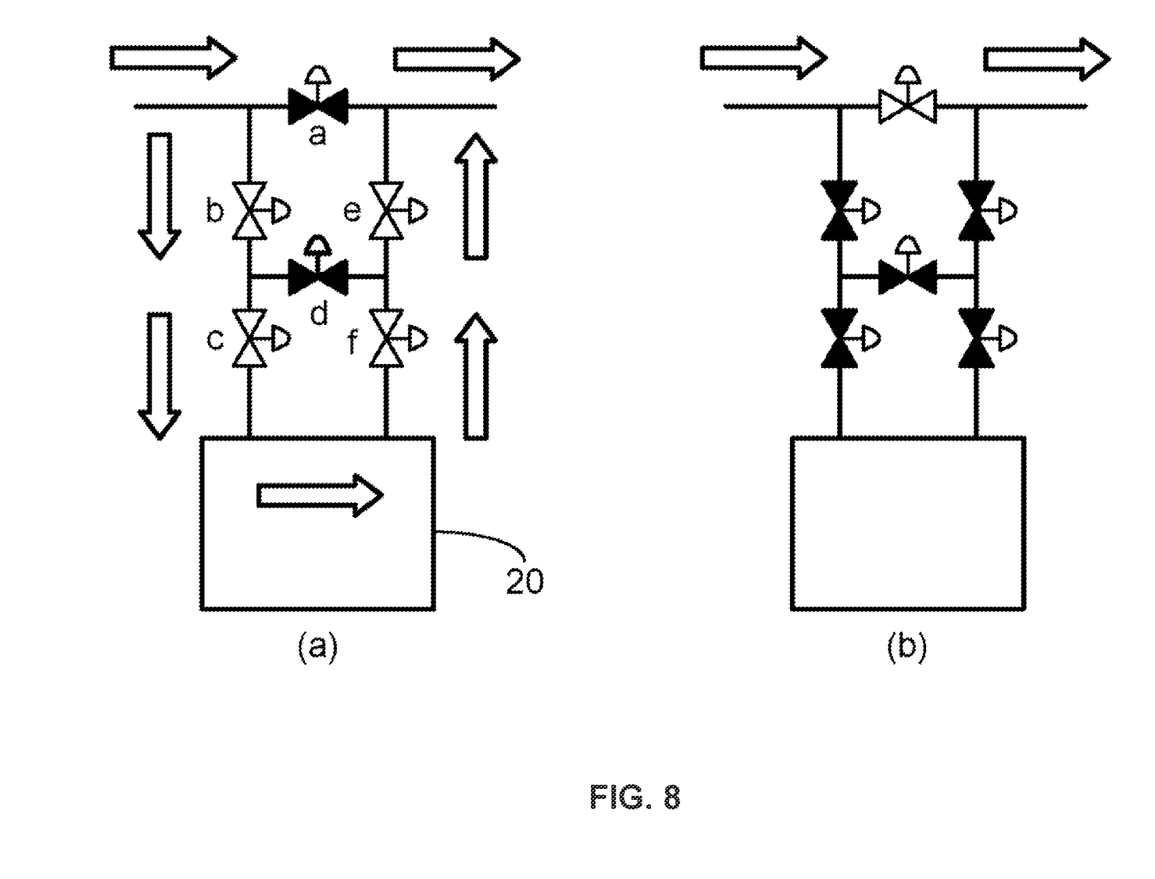
FIG. 8 illustrates a precursor supply system using a flow-pass system (FPS) usable in accordance with at least one embodiment of the present disclosure.

In some embodiments, the system for switching flow of an inert gas and flow of a precursor gas, illustrated in FIG. 8, can be used in an apparatus according to FIG. 7 to introduce a precursor gas in pulses without substantially fluctuating pressure of the reaction chamber.

Indeed, a continuous flow of the carrier gas can be accomplished using a flow-pass system (FPS), wherein a carrier gas line is provided with a detour line having a precursor reservoir (bottle), and the main line and the detour line are switched, wherein when only a carrier gas is intended to be fed to a reaction chamber, the detour line is closed, whereas when both the carrier gas and a precursor gas are intended to be fed to the reaction chamber, the main line is closed and the carrier gas flows through the detour line and flows out from the bottle together with the precursor gas. In this way, the carrier gas can continuously flow into the reaction chamber and can carry the precursor gas in pulses by switching the main line and the detour line.

FIG. 8 illustrates a precursor supply system using a flow-pass system (FPS) that can be used in an embodiment of a system as described herein (black valves indicate that the valves are closed). As shown in (a) in FIG. 8, when feeding a precursor to a reaction chamber, first, a carrier gas such as Ar (or He) flows through a gas line with valves b and c, and then enters a bottle (reservoir) (20). The carrier gas flows out from the bottle 20 while carrying a precursor gas in an amount corresponding to a vapor pressure inside the bottle 20 and flows through a gas line with valves f and e and is then fed to the reaction chamber together with the precursor. In the above, valves a and d are closed. When feeding only the carrier gas (which can be a noble gas such as He or Ar) to the reaction chamber, as shown in (b) in FIG. 8, the carrier gas flows through the gas line with the valve a while bypassing the bottle (20). In the above, valves b, c, d, e, and f are closed.

A skilled artisan will appreciate that the apparatus includes one or more controller(s) 40 programmed or otherwise configured to cause the deposition process described elsewhere herein to be conducted. Controller(s) 40 communicate with the various power sources, heating systems, pumps, robotics and gas flow controllers or valves of the reactor, as will be appreciated by the skilled artisan. Controller(s) 40 include electronic circuitry, including a processor, and software to selectively operate valves, manifolds, heaters, pumps and other components included in the system. Such circuitry and components operate to introduce precursors, reactants, and optionally purge gases from the respective sources (e.g., bottle 20). The controller can control timing of gas supply sequences, temperature of the substrate and/or reaction chamber 3, pressure within the reaction chamber 3, and various other operations to provide proper operation of the system. The controller(s) can include control software to electrically or pneumatically control valves to control flow of precursors, reactants and purge gases into and out of the reaction chamber 3. Controller(s) 40 can include modules, such as a software or hardware component, e.g., a FPGA or ASIC, which performs certain tasks. It shall be understood that where the controller includes a software component to perform a certain task, the controller is programmed to perform that particular task. A module can advantageously be configured to reside on the addressable storage medium, i.e., memory, of the control system and be configured to execute one or more processes.

Optionally, a dual chamber reactor can be used. A dual chamber reactor comprises two sections or compartments for processing wafers disposed close to each other. In such a dual chamber reactor, an inert gas can be supplied through a shared line and precursor-containing gases are provided by means of unshared lines.

The example embodiments of the disclosure described above do not limit the scope of the invention, since these embodiments are merely examples of the embodiments of the invention. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. A method of forming a phosphosilicate glass layer, the method comprising the steps of:
   providing a substrate within a reaction chamber;
   forming a silicon-containing layer overlying the substrate using a cyclical process comprising providing only a silicon precursor and an inert gas to the reaction chamber and forming an inert gas plasma using the inert gas;
   repeating the cyclical process;
   after the step of repeating the cyclical process, depositing a phosphorus-containing layer overlying the substrate, wherein the steps of depositing a silicon-containing layer and depositing a phosphorus-containing layer form a deposited phosphosilicate glass layer;
   heating the substrate in a non-oxidizing environment to cause the deposited phosphosilicate glass layer to flow to form a flowed phosphosilicate glass layer; and
   oxidizing the flowed phosphosilicate glass layer,
   wherein the step of depositing the phosphorus-containing layer comprises flowing a phosphorus-containing precursor and the inert gas to the reaction chamber,
   wherein an additional oxidant is not flowed to the reaction chamber during the step of forming the silicon-containing layer,
   wherein the silicon precursor is selected from one or more of the group consisting of bis(diethylamino)silane (BDEAS), (dimethylamino)silane (DMAS), bis(dimethylamino)silane (BDMAS), bis(ethylmethylamino)silane (BEMAS), bis(tertbutylamino)silane (BTBAS), tris(dimethylamino)silane (TDMAS), tetrakis(dimethylamino)silane (TKDMAS), and di-isopropylaminosilane (DIPAS),
   wherein an additional oxidant is not flowed to the reaction chamber during the step of depositing the phosphorus-containing layer, and
   wherein the deposited phosphorus-containing layer comprises $P_2O_3$.

2. The method of claim 1, wherein the steps of forming the silicon-containing layer and depositing the phosphorus-containing layer are each repeated to form the deposited phosphosilicate glass layer.

3. The method of claim 1, wherein the step of forming the silicon-containing layer comprises providing a pulse of the silicon precursor followed by a plasma power pulse.

4. The method of claim 1, wherein the silicon precursor is selected from the group consisting of bis(diethylamino)silane (BDEAS) and di-isopropylaminosilane (DIPAS).

5. The method of claim 1, wherein each step of forming the silicon-containing layer comprises exposing the silicon precursor to the inert gas plasma after a flow of a silicon precursor to the reaction chamber has ceased.

6. The method of claim 5, wherein each step of flowing the silicon precursor to the reaction chamber and each step of exposing the silicon precursor to the inert gas plasma do not overlap.

7. The method of claim 5, wherein the inert gas plasma is formed using an inert gas comprising nitrogen.

8. The method of claim 7, wherein the inert gas is continuously provided to the reaction chamber during the steps of forming the silicon-containing layer and depositing the phosphorus-containing layer.

9. The method of claim 1, wherein the step of depositing the phosphorus-containing layer further comprises exposing the phosphorus-containing precursor to an inert gas plasma.

10. The method of claim 9, wherein the step of flowing the phosphorus-containing precursor to the reaction chamber and the step of exposing the phosphorus-containing precursor to the inert gas plasma are repeated prior to proceeding to a subsequent deposition or heating step and wherein the steps of exposing the phosphorus-containing precursor to the inert gas plasma do not overlap.

11. The method of claim 1, wherein the step of flowing the phosphorus-containing precursor to the reaction chamber comprises flowing one or more of triethylphosphate (TEPO) or triethylphosphite (TEPI) to the reaction chamber.

12. The method of claim 1, wherein the step of depositing the phosphorus-containing layer comprises one or more of CVD, ALD, PEALD, or PECVD.

13. The method of claim 1, wherein, wherein the inert gas plasma is formed using an inert gas comprising nitrogen and one or more of argon and helium.

14. The method of claim 1, wherein the step of oxidizing the flowed phosphosilicate glass layer comprises providing one or more of $N_2O$ and $N_2$ to the reaction chamber.

15. The method of claim 1, wherein a temperature during the step of heating is less than or equal to 500° C., or less than 400° C., or less than 300° C.

16. The method of claim 1, wherein the non-oxidizing environment comprises argon and helium.

17. A method of forming a phosphosilicate glass layer, the method comprising the steps of:
   providing a substrate within a reaction chamber;
   using repeated cycles of a cyclic deposition process, forming a silicon-containing layer overlying the substrate, wherein each cycle consists essentially of providing only a silicon-containing precursor and an inert gas and exposing the silicon precursor to an inert gas plasma formed using the inert gas, wherein an additional oxidant is not flowed to the reaction chamber during the step of forming the silicon-containing layer;
   using another cyclic deposition process, depositing a phosphorus-containing layer overlying the silicon-containing layer using a plasma formed from the inert gas;
   heating the substrate in a non-oxidizing environment to cause the deposited phosphosilicate glass layer to flow to form a flowed phosphosilicate glass layer; and
   oxidizing the flowed phosphosilicate glass layer,
   wherein the steps of forming a silicon-containing layer and depositing a phosphorus-containing layer are used to form a deposited phosphosilicate glass layer,
   wherein the step of heating comprises providing one or more of argon and helium to the reaction chamber,
   wherein the inert gas is continually flowed during the steps of forming the silicon-containing layer and depositing the phosphorus-containing layer,
   wherein the silicon-containing precursor is selected from one or more of the group consisting of bis(diethylamino)silane (BDEAS), (dimethylamino)silane (DMAS), bis(dimethylamino)silane (BDMAS), bis(ethylmethylamino)silane (BEMAS), bis(tertbutylamino)silane (BTBAS), tris(dimethylamino)silane (TDMAS), tetrakis(dimethylamino)silane (TKDMAS), and di-isopropylaminosilane (DIPAS),
   and
   wherein a melting temperature of the deposited phosphorus-containing layer is less than or equal to 500° C.

18. The method of claim 17, wherein the silicon precursor is selected from one or more of the group consisting of (dimethylamino)silane (DMAS), bis(dimethylamino)silane (BDMAS), bis(ethylmethylamino)silane (BEMAS), bis(tertbutylamino)silane (BTBAS), tris(dimethylamino)silane (TDMAS), tetrakis(dimethylamino)silane (TKDMAS), and di-isopropylaminosilane (DIPAS).

\* \* \* \* \*